(12) United States Patent
Lee et al.

(10) Patent No.: US 10,319,423 B2
(45) Date of Patent: Jun. 11, 2019

(54) MEMORY DEVICE WITH A LOW-CURRENT REFERENCE CIRCUIT

(71) Applicant: Taiwan Semiconductor Manufacturing Company Limited, Hsinchu (TW)

(72) Inventors: Chia-Fu Lee, Hsinchu (TW); Hon-Jarn Lin, Hsinchu (TW); Yu-Der Chih, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/800,700

(22) Filed: Nov. 1, 2017

(65) Prior Publication Data
US 2018/0151211 A1 May 31, 2018

Related U.S. Application Data

(60) Provisional application No. 62/426,695, filed on Nov. 28, 2016.

(51) Int. Cl.
| | | |
|---|---|---|
| G11C 11/16 | (2006.01) | |
| G11C 7/06 | (2006.01) | |
| G11C 11/15 | (2006.01) | |
| H01L 43/02 | (2006.01) | |
| G11C 7/14 | (2006.01) | |

(52) U.S. Cl.
CPC ............. *G11C 11/161* (2013.01); *G11C 7/06* (2013.01); *G11C 7/062* (2013.01); *G11C 7/14* (2013.01); *G11C 11/15* (2013.01); *G11C 11/1673* (2013.01); *G11C 11/1675* (2013.01); *H01L 43/02* (2013.01); *G11C 11/165* (2013.01); *G11C 2207/063* (2013.01)

(58) Field of Classification Search
CPC .................................................. G11C 11/1673
USPC .................................................. 365/209, 158
See application file for complete search history.

(56) References Cited

U.S. PATENT DOCUMENTS

| | | | | |
|---|---|---|---|---|
| 6,985,383 B2 * | 1/2006 | Tang | ........................ | G11C 5/147 365/148 |
| 7,813,166 B2 * | 10/2010 | Jung | ..................... | G11C 11/1673 365/158 |
| 7,835,210 B2 * | 11/2010 | Shimizu | .................. | B82Y 10/00 365/158 |
| 7,952,916 B2 * | 5/2011 | Maeda | ..................... | G11C 11/16 365/158 |
| 8,254,195 B2 * | 8/2012 | Rao | .......................... | G11C 11/16 365/157 |
| 8,446,753 B2 * | 5/2013 | Kim | .......................... | G11C 8/10 365/148 |

(Continued)

*Primary Examiner* — Son L Mai
(74) *Attorney, Agent, or Firm* — Jones Day (57) ABSTRACT

A memory device includes a memory cell unit, a reference circuit, and a sense amplifier. The memory cell unit includes a memory cell. The reference circuit is configured to generate a reference current and includes a plurality of magnetic resistive elements. At least one of the magnetic resistive elements is in a high resistance state. The sense amplifier is coupled to the memory cell unit and the reference circuit and is configured to compare a current that flows through the memory cell to the reference current to sense a bit of data stored in the memory cell, to amplify a level of the sensed bit of data, and to output the amplified bit of data.

20 Claims, 7 Drawing Sheets

(56) References Cited

U.S. PATENT DOCUMENTS

| | | | |
|---|---|---|---|
| 8,687,412 B2 * | 4/2014 | Chih | G11C 11/1673 365/158 |
| 8,693,273 B2 * | 4/2014 | Yuh | G11C 11/1673 365/148 |
| 9,142,293 B2 * | 9/2015 | Hatsuda | G11C 13/004 |
| 9,165,629 B2 * | 10/2015 | Chih | G11C 11/1673 |
| 2011/0157971 A1 * | 6/2011 | Kim | G11C 11/16 365/171 |

* cited by examiner

MEMORY DEVICE WITH A LOW-CURRENT REFERENCE CIRCUIT

CROSS-REFERENCE TO RELATED APPLICATIONS

This application claims priority to U.S. Provisional Application 62/426,695, filed Nov. 28, 2016, the entirety of which is herein incorporated by reference.

BACKGROUND

A magnetoresistive random-access memory (MRAM), includes memory cells configured to store bits of data therein. A memory cell of the MRAM includes an MRAM element operable so as to switch between a high resistance state that represents a logic "1" value and a low resistance state that represents a logic "0" value. A bit of data, a logic "0" or "1" value, stored in the memory cell is determined by comparing a current that flows through the memory cell to a reference current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
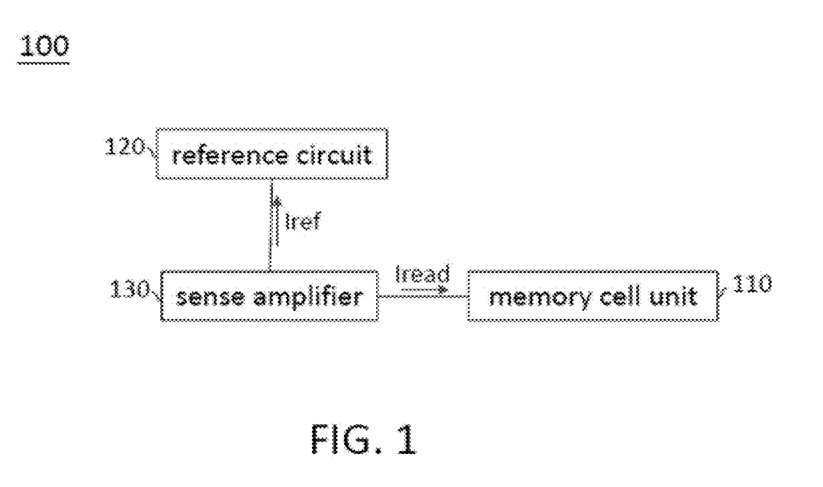
FIG. 1 is a schematic diagram illustrating the first exemplary embodiment of a memory device according to the present disclosure.
Figure 2:
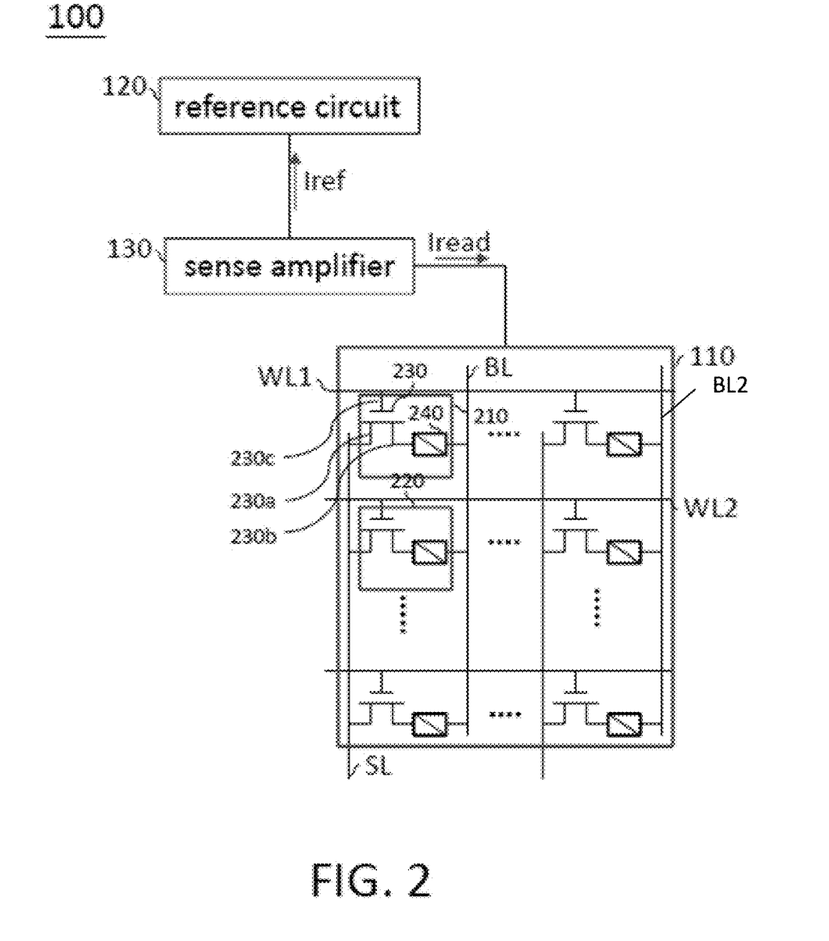
FIG. 2 is a schematic diagram illustrating an exemplary memory cell unit of the memory device according to the present disclosure.
Figure 3:
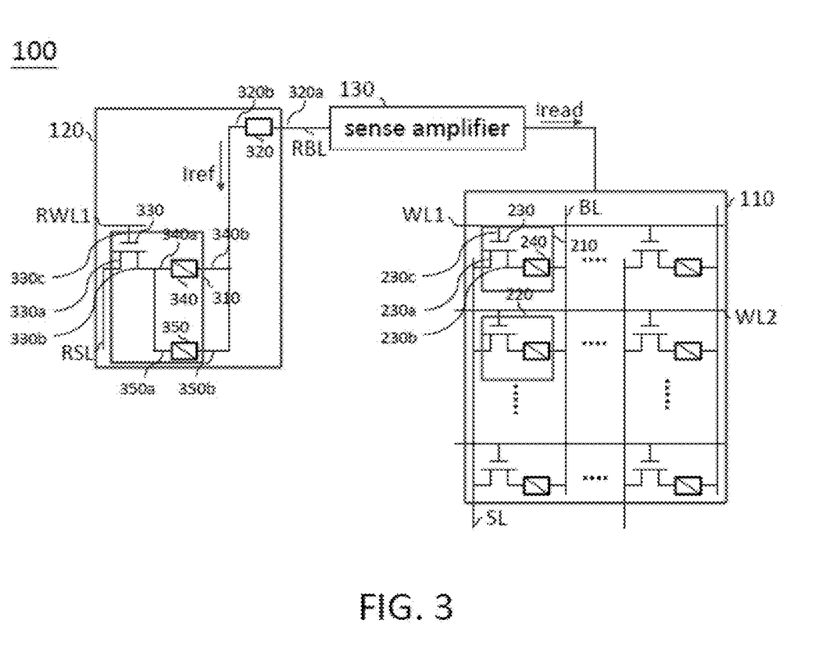
FIG. 3 is a schematic diagram illustrating an exemplary reference circuit of the memory device according to the present disclosure.

A memory device, e.g., the memory device 100 in FIGS. 1-3, includes a memory cell unit 110, a reference circuit 120, and a sense amplifier 130 connected to the memory cell unit 110 and the reference circuit 120. The memory cell unit 110 includes one or more memory cells, e.g., the memory cell 210 in FIG. 2, configured to store a bit of data therein. In the example of FIG. 2, the memory cell 210 includes a transistor 230 and a resistive element 240 in the form of a mutual tunnel junction (MTJ).

An example MTJ 240 includes a pair of magnetic layers and a non-magnetic layer, e.g., an insulator layer, between the magnetic layers. A magnetization of one of the magnetic layers, hereafter referred to as the reference layer, has a fixed direction, whereas a magnetization of the other of the magnetic layers, hereafter referred to as the free layer, has a direction that can be switched between a parallel state and an anti-parallel state. In the parallel state, the direction of the magnetization of the free layer is the same as the direction of the magnetization of the reference layer. In the anti-parallel state, the direction of the magnetization of the free layer is opposite to the direction of the magnetization of the reference layer.

When the free layer of the MTJ 240 is in the parallel state, the MTJ 240 exhibits a low resistance that represents a logic "0" value and the MTJ 240 is said to be in a parallel state or a low resistance state. Conversely, when the free layer is in the anti-parallel state, the MTJ 240 exhibits a high resistance that represents a logic "1" value and the MTJ 240 is said to be in an anti-parallel state or a high resistance state. When it is desired to switch the MTJ 240 from the anti-parallel state to the parallel state, a switch current is passed through the MTJ 240 from the free layer to the reference layer. Conversely, when it is desired to switch the MTJ 240 from the parallel state to the anti-parallel state, a switch current is passed through the MTJ 240 from the reference layer to the free layer.

With reference back to FIG. 1, in an exemplary read operation, read voltages are applied to the memory device 100, whereby a read current (Iread) flows between the memory cell unit 110 and the sense amplifier 130 and a reference current (Iref) between the reference circuit 120 and the sense amplifier 130. The levels of the currents (Iread, Iref) are dictated by the resistances of the respective memory cell unit 110 and the reference circuit 120. Then, the sense amplifier 130 compares the read current (Tread) to the reference current (Iref) to sense a bit logic "0" or "1" value of data stored in the memory cell of the memory cell unit 110. When it is determined that the read current (Iread) is less than the reference current (Iref), the sense amplifier 130 senses a logic "1" value. Conversely, when it is determined that the read current (Iread) is greater than the reference current (Iref), the sense amplifier 130 senses a logic "0" value. The sense amplifier 130 amplifies the level of that sensed bit of data and provides the amplified bit of data as an output, such that the bit of data can be read from the memory cell.

In some other approaches, the reference circuit 120 includes only MTJ(s) having their free layer in a parallel state. That reference circuit 120 results in a complex structure that undesirably generates a high reference current. As will be described hereinafter, the present disclosure provides a memory device comprising a reference circuit 120 that does not include, i.e., is void of, an MTJ in a parallel state, resulting in a simple structure that generates a low reference current.

FIG. 1 is a schematic diagram illustrating the first exemplary embodiment of a memory device 100 according to the present disclosure. The memory device 100 includes a memory cell unit 110, a reference circuit 120, and a sense amplifier 130. In some embodiments, the memory device 100 is a non-volatile memory device, including, e.g., a magnetoresistive random access memory (MRAM). In other embodiments, the memory device 100 is a volatile memory device. In certain embodiments, the memory device 100 is a read-only memory device.

The memory cell unit 110 includes a memory cell configured to store a bit logic "0" or "1" value of data therein and to allow a read current (Iread) to flow therethrough. Although the read current (Iread) is exemplified in FIG. 1 as flowing from the sense amplifier 130 to the memory cell unit 110, the read current (Iread) may flow from the memory cell unit 110 to the sense amplifier 130.

FIG. 2 is a schematic diagram illustrating an exemplary memory cell unit 110 of the memory device 100 according to the present disclosure. In this embodiment, the memory cell unit 110 includes a plurality of the memory cells arranged in an array of rows and columns. For clarity of illustration, only two of the memory cells are labeled in FIG. 2, i.e., one of the memory cells in the first row labeled as 210 and one of the memory cells in the second row labeled as 220.

As illustrated in FIG. 2, the memory device 100 further includes word lines (WL1, WL2), bit lines (BL, BL2), and a source line (SL). The word line (WL1) connects the memory cells 210 in the first row. The word line (WL2) connects the memory cells 220 in the second row. The bit lines (BL, BL2) and the source line connect the memory cells 210, 220. Bit lines BL, BL2 can be selectively connected to the sense amplifier 130 via switches (not shown) depending on exactly which memory cell in the array is to be read to or written from.

Because the memory cells 210, 220 are the same in construction and operation, only one, i.e., the memory cell 210, will be described here. In this embodiment, the memory cell 210 includes a transistor 230 and a resistive element 240. The transistor 230 is a field-effect transistor (FET), e.g., a metal-oxide semiconductor FET (MOSFET), and includes a first source/drain terminal 230a connected to the source line (SL), a second source/drain terminal 230b, and a gate terminal 230c connected to the word line (WL1). In an alternative embodiment, the memory device 100 does not include the source line (SL). In such an alternative embodiment, the first source/drain terminal 230a of the transistor 230 is connected to a ground or other node of the memory device 100. The transistor 230 may be any type of transistor, including, e.g., a junction-type transistor, such as a bipolar junction transistor (BJT).

The resistive element 240 is connected between the second source/drain terminal 230b of the transistor 230 and the bit line (BL). In this embodiment, the resistive element 240 is an MTJ. The resistive element 240 may be any type of resistive element or circuit so long as it achieves the intended function described herein.

In an exemplary write operation, write voltages are applied to the bit line (BL), the source line (SL), and the word line (WL1). A positive voltage on WL1 activates the transistor 230 and a write current passes/flows through the memory cell 210. That write current flows through the resistive element, causing the resistive element to switch from a parallel state to an anti-parallel state or vice versa, whereby a bit of data is written and stored in the memory cell 210. When it is desired to switch the MTJ 240 from the anti-parallel state to the parallel state to store a "0" value, a switch current is passed through the MTJ 240 from the free layer to the reference layer. Conversely, when it is desired to switch the MTJ 240 from the parallel state to the anti-parallel state to store a "1" value, a switch current is passed through the MTJ 240 from the reference layer to the free layer.

With further reference to FIG. 1, in some embodiments, the reference circuit 120 is configured to generate a reference current (Iref), e.g., 25 uA. Although the reference current (Iref) is exemplified in FIG. 1 as flowing from the sense amplifier 130 to the reference circuit 120, the reference current (Iref) may flow from the reference circuit 120 to the sense amplifier 130.

In an exemplary read operation, read voltages are applied to the bit line (BL), the source line associated with a column of a selected bit to be read (e.g., SL), and the word line associated with a word of a selected bit to be read (e.g., WL1). For example, a voltage is applied to word line (WL1) to activate the transistor 230, which corresponds with the bit stored at position 1, 1 (i.e., the upper left cell) of the memory cell unit 110. To select other cells, different combinations of source lines and word lines are activated to produce a read current indicative of the data stored at that cell.

When cell 1, 1 is selected, a read current (Iread) flows through the memory cell 210, including through the resistive element 240 inside the memory cell. The magnitude of the read current (Iread) corresponds to a resistance state of the resistive element 240. For example, when the resistive element 240 is in a low resistance state, i.e., a parallel state, the read current (Iread) will be greater than the reference current (Iref). This indicates that the memory cell 210 stores a bit logic "0" value of data therein. Conversely, when the resistive element 240 is in a high resistance state, i.e., an anti-parallel state, the read current (Iread) will be less than the reference current (Iref). This indicates that the memory cell 210 stores a bit logic "1" value of data therein. Then, the sense amplifier 130 compares the read current (Tread) to the reference current (Iref) to sense a bit logic "0" or "1" value of data stored in the memory cell 210. The sense amplifier 130 amplifies a level of the sensed bit of data and outputs the amplified bit of data such that the bit of data stored in the memory cell 210 can be read therefrom.

In order for the sense amplifier 130 to accurately sense the bit of data stored in the memory cell 210, the amount of the reference current (Iref) should be between the amount of a read current (Iread) when the resistive element 240 is in the parallel state and the amount of a read current (Iread) when the resistive element 240 is in the anti-parallel state. It should be understood that an MTJ is susceptible to temperature and process variations. As such, in order for the reference circuit 120 to generate such a reference current (Iref), in some embodiments, the reference circuit 120 includes a resistive element that has the same type as the resistive element 240 of the memory cell 210 (e.g., the resistive element of the reference circuit 120 and the resistive element 240 of the memory cell 210 are MTJs). This allows the reference circuit 120 to track temperature and process variations of the resistive element 240 of the memory cell 210. A voltage/current source that generates constant reference voltage/current is not capable of tracking temperature and process variations of an MTJ.

Furthermore, in order for the reference circuit 120 to have a simple structure that generates a low reference current (Iref), in some embodiments, the reference circuit 120 does not include a resistive element in a parallel state. A reference circuit that includes a resistive element in a parallel state requires additional components, e.g., pass gates, that will make a structure of such a reference circuit complex. Instead, in some embodiments, prior to operation of the reference circuit 120, the resistive element is first switched to an anti-parallel state. The anti-parallel, high resistance state, produces a reference current that is of a lesser magnitude than implementations that route the reference current through the parallel state resistive elements. By routing the reference current through a combination of one or more resistive elements in an anti-parallel state, a reference current (Iref) can be generated having a magnitude between the magnitude of the read current (Iread) when the memory cell contains a "0" data value and the magnitude of the read current (Iread) when the memory cell contains a "1" data value.

Various exemplary embodiments of the reference circuit 120 will now be described with reference to FIGS. 3-5.

FIG. 3 is a schematic diagram illustrating an exemplary reference circuit 120 of the memory device 100 according to the present disclosure. The reference circuit 120 includes a sub-circuit 310 and a resistive unit 320 (e.g., a single resistor, an arrangement of resistors, or other circuitry that provides a resistive contribution to a circuit). The memory device 100 further includes a reference word line (RWL1), a reference bit line (RBL), and a reference source line (RSL).

In this embodiment, the sub-circuit 310 includes a transistor 330 and N resistive elements (two of the N resistive elements being depicted at 340, 350). The number of resistive elements (e.g., 340, 350) is selected in order to generate a desired reference current (Iref). As discussed in further detail below, the reference current (Iref) generated by reference circuit 120 is based on the sum of currents flowing through the arrangement of the resistive elements (e.g., N resistive elements arranged in series, parallel, or a combination of series and parallel). Thus, the resistive elements can be arranged so as to produce the desired reference current (Iref) (e.g., a current between the read current (Iread) generated by a stored "0" value versus a stored "1" value.

The transistor 330 is an FET, e.g., a MOSFET, and includes a first source/drain terminal 330a connected to the reference source line (RSL), a second source/drain terminal 330b, and a gate terminal 330c connected to the reference word line (RWL1). In an alternative embodiment, the memory device 100 does not include the reference source line (RSL). In such an alternative embodiment, the first source/drain terminal 330a of the transistor 330 is connected to, e.g., the ground or other node of the memory device 100. The transistor 330 may be any type of transistor, including, e.g., a junction-type transistor, such as a BJT.

The resistive elements 340, 350 are of the same type as the resistive element 240 (e.g., the resistive elements 240, 340, 350 are MTJs) and are in an anti-parallel state. In this embodiment, the resistive elements 340, 350 are connected in parallel and each have first and second MTJ terminals 340a, 340b, 350a, 350b. As illustrated in FIG. 3, the first MTJ terminals 340a, 350a of the resistive elements 340, 350 are connected to each other and to the second source/drain terminal 330b of the transistor 330.

The resistive unit 320 has a substantially constant resistance, is connected in series with the resistive elements 340, 350, and has first and second resistive unit terminals 320a, 320b. In this embodiment, the resistive unit 320 has a resistance of about half of a resistance of the resistive element 340/350 when the resistive element 340/350 is in a parallel state. As illustrated in FIG. 3, the first resistive unit terminal 320a of the resistive unit 320 is connected to the sense amplifier 130 through the reference bit line (RBL). The second MTJ terminals 340b, 350b of the resistive elements 340, 350 are connected to each other and to the second resistive unit terminal 320b of the resistive unit 320.

In some embodiments, resistive elements 340, 350 are initially in a parallel state or an indeterminate state. Prior to operation of the reference circuit 120, when the resistive elements 340, 350 are in a parallel or indeterminate state, switch voltages are applied to the reference bit line (RBL), the reference source line (RSL), and the reference word line (RWL1). This activates the transistor 330 and switch currents flow through the resistive elements 340, 350. This, in turn, switches the resistive elements 340, 350 to an anti-parallel state.

In an exemplary operation of the reference circuit 120, reference voltages are applied to the reference bit line (RBL), the reference source line (RSL), and the reference word line (RWL1). This activates the transistor 330 and the reference circuit 120 generates a reference current (Iref). In this embodiment, the reference current (Iref) corresponds to the sum of the resistance of the resistive unit 320 and the total resistance of the resistive elements 340, 350. As illustrated in FIG. 3, the reference current (Iref) is equal to a current that flows through the resistive unit 320 or the sum of currents that flow through the resistive elements 340, 350.

With further reference to FIG. 1, the sense amplifier 130 is connected to the memory cell unit 110 and the reference circuit 120 and is configured to compare the read current (Iread) to the reference current (Iref) to sense a bit of data stored in the memory cell 210. The sense amplifier 130 is further configured to amplify a level of the sensed bit of data and to output the amplified bit of data, such that the bit of data can be read from the memory cell 210. In some embodiments, the sense amplifier 130 is a differential sense amplifier. In other embodiments, the sense amplifier 130 is a single ended sense amplifier.

In an exemplary read operation, read voltages are applied to the bit line (BL), the source line (SL), and the word line (WL1). This activates the transistor 230 and a read current (Iread) flows through the memory cell 210. At this time, reference voltages are applied to the reference bit line (RBL), the reference source line (RSL), and the reference word line (RWL1). This activates the transistor 330 and the reference circuit 120 generates a reference current (Iref). The level of the reference voltage applied to the reference word line (RWL1) may be the same as or different from the level of the read voltage applied to the word line (WL1). Then, the sense amplifier 130 compares the read current (Iread) to the reference current (Iref) to sense a bit of data stored in the memory cell 210. The sense amplifier 130 amplifies a level of the sensed bit of data and outputs the amplified bit of data, such that the bit of data stored in the memory cell 210 can be read therefrom.

Figure 4:
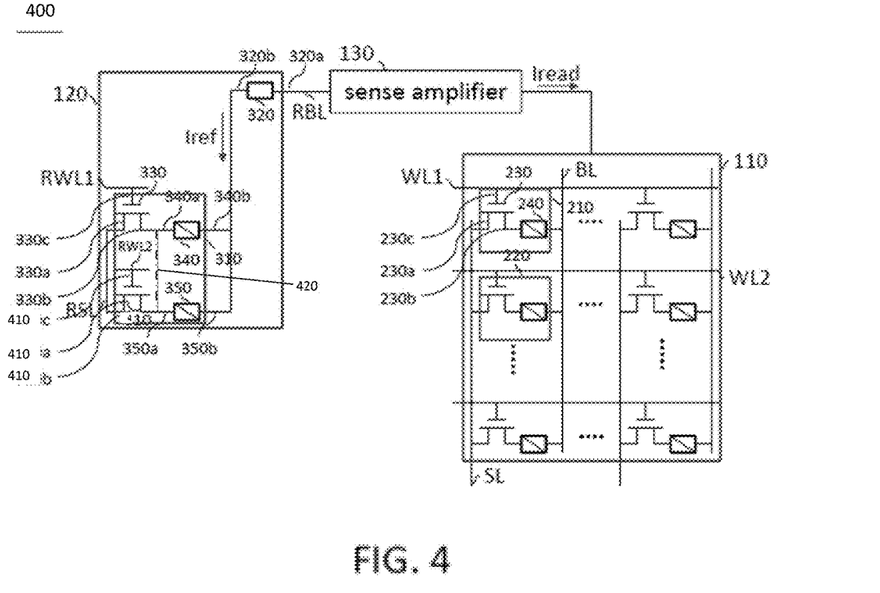
FIG. 4 is a schematic diagram illustrating the second exemplary embodiment of a memory device according to the present disclosure.

FIG. 4 is a schematic diagram illustrating the second exemplary embodiment of a memory device 400 according to the present disclosure. The embodiment of FIG. 4 includes M resistive elements (e.g., resistive elements 340, 350 depicted in FIG. 4) connected in parallel between resistive unit 320 and a plurality (e.g., M) of reference word lines that act as switches.

As noted above, prior to operation of the reference circuit 120, resistive elements 340, 350 may be in a parallel or indeterminate state. The reference circuit 120 includes multiple reference word lines (RWL1, RWL2) that can be selectively controlled during initialization to activate transistors 330, 410, respectively to apply switch currents to the corresponding resistive elements 340, 350. This, in turn, switches those resistive elements 340, 350 to an anti-parallel state. Transistors 330, 410 are, in one embodiment, selected to ensure that the switch currents are sufficient to switch the resistive elements 340, 350 from the parallel state to the anti-parallel state.

In one embodiment, an array of rows (e.g., 2 or more) resistive elements (e.g., resistive element 340) and corresponding control transistors (e.g., transistor 330 controlled by reference word line RW1) are available. Control signals are selectively applied to a transistor of a row to control whether the corresponding resistive element is in a parallel or anti-parallel state to provide a desired resistance to generate a corresponding desired reference current Iref.

Describing the reference circuit 410, in further exemplary detail, the transistor 410 is an FET, e.g., a MOSFET, and includes a first source/drain terminal 410a connected to the reference source line (RSL), a second source/drain terminal 410b connected to the second source/drain terminal 330b of the transistor 330, and a gate terminal 410c connected to the reference word line (RWL2). In an alternative embodiment, the memory device 400 does not include the source line (RSL). In such an alternative embodiment, the first source/drain terminals 330a, 410a of the transistors 330, 410 are connected to, e.g., the ground or other node of the memory device 400. In certain embodiments, the transistor 410 may be any type of transistor, including, e.g., a junction-type transistor, such as a BJT.

The example of FIG. 4 further includes a metal short 420 between the terminals 340a and 350a. As noted above, both transistors 330 and 410 are used to apply sufficient current to place resistive elements 340, 350 into the anti-parallel state during initialization. During active memory operations (i.e., when the reference current Iref is being generated for comparisons at the sense amplifier 130), metal short 420 allows the reference current Iref to be generated through control of only one of transistors 330, 410. For example, when the reference current Iref is to be generated, an activation signal can be applied to reference word line RWL1 to activate transistor 330. The reference current Iref then flows through resistive unit 320, in parallel through resistive elements 340, 350, and through transistor 330, with the portion of the current flowing through resistive element 350 traversing metal short 420. Alternatively, when the reference current Iref is to be generated, an activation signal can be applied to reference word line RWL2 to activate transistor 410. The reference current Iref then flows through resistive unit 320, in parallel through resistive elements 340, 350, and through transistor 410, with the portion of the current flowing through resistive element 340 traversing metal short 420.

In an exemplary read operation, read voltages are applied to the bit line (BL), the source and word lines associated with a desired cell to be read from (e.g., source line (SL), and the word line (WL1)). This activates the transistor 230 and a read current (Iread) flows through the memory cell 210. At this time, reference voltages are applied to the reference bit line (RBL), the reference source line (RSL), and one of the reference word lines (in this example RWL1). This activates the transistor 330 and deactivates the transistor 410 and the reference circuit 120 generates a reference current (Iref) that traverses resistive elements 340, 350 in parallel in their previously set states. The level of the reference voltages applied to the reference word line (RWL1) may be the same as or different from the level of the read voltages applied to the word lines (WL1, WL2). Then, the sense amplifier 130 compares the read current (Iread) to the reference current (Iref) to sense a bit of data stored in the memory cell 210. The sense amplifier 130 amplifies a level of the bit of data and outputs the amplified bit of data, such that the bit of data stored in the memory cell 210 can be read therefrom.

Figure 5:
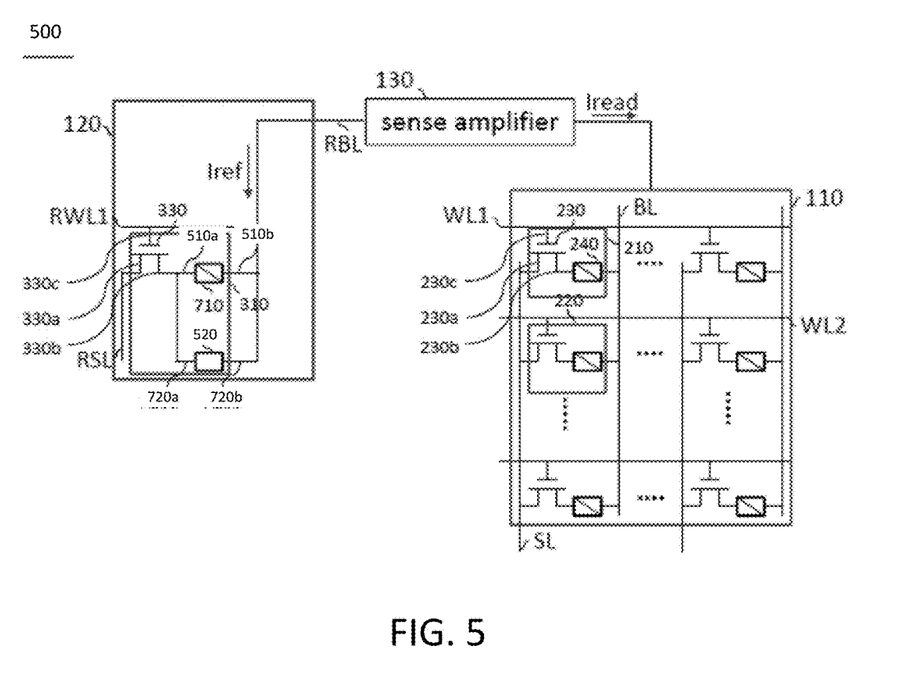
FIG. 5 is a schematic diagram illustrating the third exemplary embodiment of a memory device according to the present disclosure.

FIG. 5 is a schematic diagram illustrating the third exemplary embodiment of a memory device 500 according to the present disclosure. This embodiment differs from the memory device 100 in that the reference circuit 120 does not include the resistive unit 320. Instead of utilizing a set of N resistive elements arranged in parallel, as depicted in FIGS. 3-4, the embodiment of FIG. 5 positions a resistive unit 520 on one of the P parallel paths, along with P−1 resistive elements (e.g., one resistive element 510 is illustrated in the embodiment of FIG. 5). In the example of FIG. 5, upon activation of RWL1 and transistor 330, current flows through each of the parallel paths to generate the reference current (Iref). But, in other embodiments, additional control lines and corresponding control transistors can be used to selectively determine the number of parallel paths (i.e., turn on and off parallel paths, including the path that contains the resistive unit 520) utilized to generate the reference current (Iref).

The resistive element 510 is of the same type as the resistive element 240 (e.g., the resistive elements 240, 510 are MTJs) and is in an anti-parallel state. As illustrated in FIG. 5, the resistive element 510 has first and second MTJ terminals 510a, 510b. The resistive unit 520 has a substantially constant resistance and has first and second resistive unit terminals 520a, 520b. In this embodiment, the resistive unit 520 has a resistance that is selected such that the reference current (Iref) will be between the expected current resulting from a "0" data value and the expected read current (Iread) expected from a "1" data value (e.g., greater than 2 times the resistance of the resistive element 510 when the resistive element 510 is in a parallel state, such as 6 times). As illustrated in FIG. 5, the first MTJ terminal 510a of the resistive element 510 and the first resistive unit terminal 520a of the resistive unit 520 are connected to each other and to the second source/drain terminal 330b of the transistor 330. The second MTJ terminal 510b of the resistive element 510 and the second resistive unit terminal 520b of the resistive unit 520 are connected to each other and to the sense amplifier 130 through the reference bit line (RBL).

Prior to operation of the reference circuit 120, when the resistive element 510 is in a parallel state, switch voltages are applied to the reference bit line (RBL), the reference source line (RSL), and the reference word line (RWL1). This activates the transistor 330 and a switch current flows through the resistive element 510. This, in turn, switches the resistive element 510 to an anti-parallel state.

In an exemplary operation of the reference circuit 120, reference voltages are applied to the reference bit line (RBL), the reference source line (RSL), and the reference word line (RWL1). This activates the transistor 330 and the reference circuit 120 generates a reference current (Iref). In this embodiment, the reference current (Iref) corresponds to the total resistance of the resistive element 510 and the resistive unit 520. As illustrated in FIG. 5, the reference current (Iref) is equal to the sum of currents that flow through the resistive element 510 and the resistive unit 520.

In an exemplary read operation, read voltages are applied to the bit line (BL), the source line (SL), and the word line (WL1). This activates the transistor 230 and a read current (Iread) flows through the memory cell 210. At this time, reference voltages are applied to the reference bit line (RBL), the reference source line (RSL), and the reference word line (RWL1). This activates the transistor 330 and the reference circuit 120 generates a reference current (Iref). The level of the reference voltage applied to the reference word line (RWL1) may be the same as or different from the level of the read voltage applied to the word line (WL1). Then, the sense amplifier 130 compares the read current (Iread) to the reference current (Iref) to sense a bit of data stored in the memory cell 210. The sense amplifier 130 amplifies a level of the sensed bit of data and outputs the amplified bit of data, such that the bit of data stored in the memory cell 210 can be read therefrom.

Figure 6:
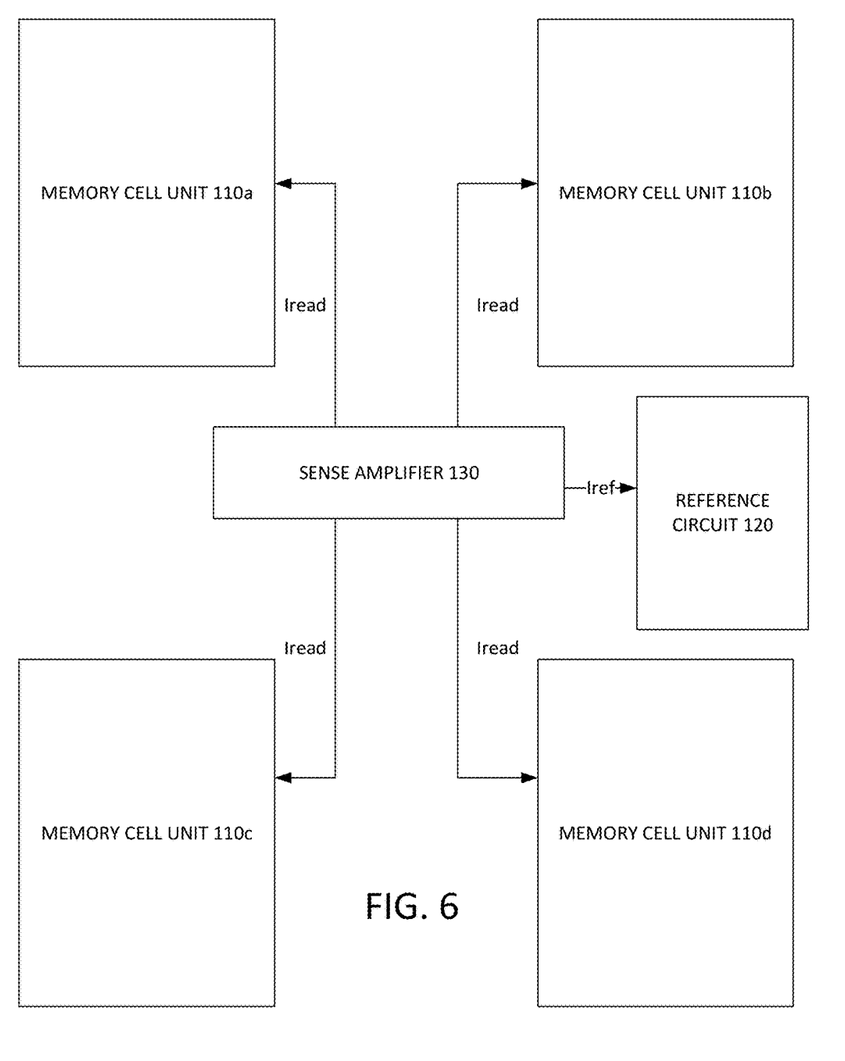
FIG. 6 is a diagram depicting a single reference circuit providing a reference current for reading data from multiple memory cell units according to the present disclosure.

FIG. 6 is a diagram depicting a single reference circuit providing a reference current for reading data from multiple memory cell units according to the present disclosure. The previous examples have illustrated a reference circuit 120 providing a reference current Iref to a sense amplifier 130 to compare to a read current Iread generated when a particular cell of a single memory cell unit 110 is selected (e.g., using a word line and source line associated with that cell). In one embodiment, a single reference circuit 120 can provide a reference current Iref that is used by a sense amplifier 130 for reading data stored across a plurality of memory cell units. The example of FIG. 6 depicts four such memory cell units 110a-d. In that example, the multiple memory cell units 110a-d are each connected to the sense amplifier 130 (the memory cell units 110a-d could also be connected to the sense amplifier 130 via a bus). During a read operation, a selected memory cell in one of those multiple memory cell units 110a-d is activated via source line and word line command signals to produce a read current Iread. Regardless of which of the multiple memory cell units 110a-d has its cell selected, the sense amplifier 130 will compare the corresponding read current Iread to the reference current Iref produced by reference circuit 120. Thus, the single reference circuit 120 can service multiple memory cell units 110a-d (i.e., 2 or more).

Figure 7:
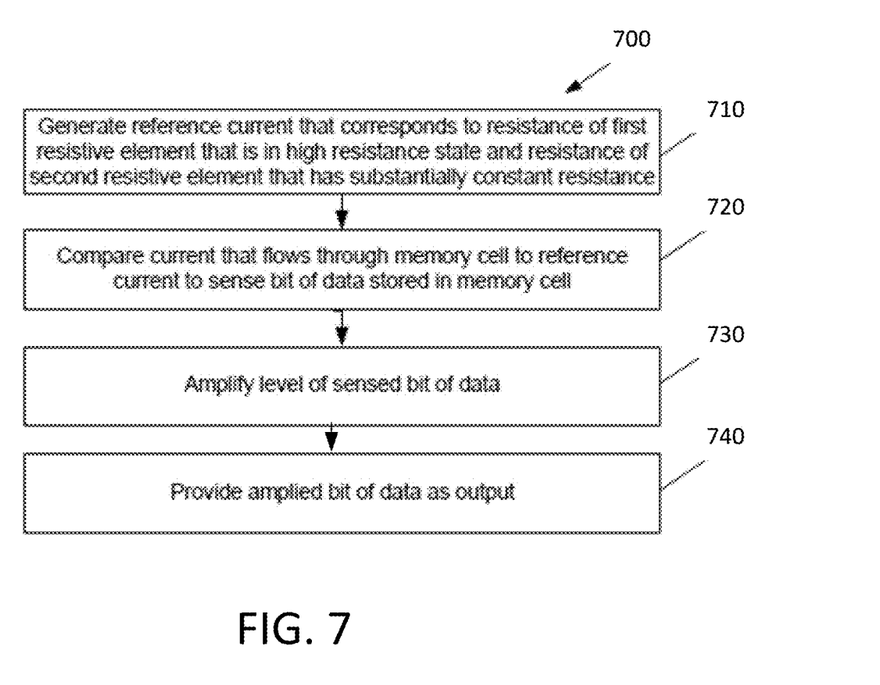
FIG. 7 is a flow diagram depicting a method of operation for an exemplary embodiment of a memory device according to the present disclosure.

FIG. 7 is flow diagram that that illustrates a method of operation for an exemplary embodiment of a memory device according to the present disclosure. It is understood that the method of FIG. 7 is applicable to many different structures. But, as an aid in understanding, reference herein is made to certain exemplary structures of FIG. 3. At 710, a reference current (Iref) that corresponds to a resistance of a resistive element (340) that is in a high resistance state and a resistance of a resistive unit (320) that has a substantially constant resistance is generated. At 720, a current (Iread) that flows through a memory cell (210) is compared to the reference current (Iref) to sense a bit of data stored in the memory cell (210). At 730, a level of the sensed bit of data is amplified by a sense amplifier (130). The amplified bit of data is provided as an output at 740.

Systems and methods as described herein provide for a reference circuit that utilizes an arrangement of resistive elements to generate a reference current. In one embodiment, at least one of those resistive elements in the reference circuit is put into an anti-parallel state, so as to provide a lesser reference current for comparison during read operations. The magnitude of the reference current can be selectively adjusted in a variety of ways. For example, the arrangement (e.g., serial, parallel, a combination of serial and parallel) of the resistive elements in the reference circuit can be implemented so as to generate a desired reference current level. In another example, control signals and corresponding control transistors can be implemented so as to selectively control the arrangement of active resistive elements, even in real time.

In an embodiment, a memory device comprises a memory cell unit, a reference circuit, and a sense amplifier. The memory cell unit includes a memory cell. The reference circuit is configured to generate a reference current and includes a plurality of magnetic resistive elements. At least one of the magnetic resistive elements is in a high resistance state. The sense amplifier is coupled to the memory cell unit and the reference circuit and is configured to compare a current that flows through the memory cell to the reference current to sense a bit of data stored in the memory cell, to amplify a level of the sensed bit of data, and to output the amplified bit of data.

In another embodiment, a memory device comprises a memory cell unit, a sense amplifier, and a reference circuit. The memory cell unit includes a memory cell. The sense amplifier is coupled to the memory cell unit and is configured to compare a current that flows through the memory cell to a reference current to sense a bit of data stored in the memory cell, to amplify a level of the sensed bit of data, and to output the amplified bit of data. The reference circuit is coupled to the sense amplifier, is configured to generate the reference current, and includes a pair of magnetic resistive elements coupled in parallel and in a high resistance state and a pair of transistors coupled to the resistive elements.

In another embodiment, a method comprises generating a reference current that corresponds to a resistance of a magnetic resistive element that is in a high resistance state, comparing a current that flows through a memory cell to the reference current to sense a bit of data stored in the memory cell, amplifying a level of the sensed bit of data, and providing as an output of the amplified bit of data.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   a memory cell unit including a memory cell;
   a reference circuit configured to generate a reference current and including:
      an arrangement of a plurality of resistive elements, at least one of which is a magnetic resistive element in a high resistance state;

at least two transistors coupled to the plurality of resistive elements and coupled to each other;

a metal short between at least two of the plurality of resistive elements and the at least two transistors, the metal short configured to control the generation of the reference current; and a sense amplifier coupled to the memory cell unit and the reference circuit and configured to compare a current that flows through the memory cell to the reference current to sense a bit of data stored in the memory cell and to output the sensed bit of data.

2. The memory device of claim 1, wherein the resistive elements are arranged in parallel with each other.

3. The memory device of claim 1, further comprising a second memory cell unit coupled to the sense amplifier;

wherein the reference circuit provides the reference current to the sense amplifier for the sense amplifier to use when sensing a bit of data stored in the second memory cell unit.

4. The memory device of claim 1, wherein multiple control transistors of the reference circuit are controlled during initialization to set a desired resistance of the reference circuit;

wherein a single one of the multiple control transistors is operated to generate the reference current.

5. The memory device of claim 1, wherein the reference current is based on a sum of currents that flow through the plurality of resistive elements.

6. The memory device of claim 1, wherein the magnetic resistive element in a high resistance state is a magnetic tunnel junctions (MTJ) in an anti-parallel state.

7. The memory device of claim 1, wherein the reference circuit further includes:

a resistive unit that is coupled to a magnetic resistive element and that has a substantially constant resistance.

8. The memory device of claim 7, wherein the magnetic resistive element and the resistive unit are coupled in parallel.

9. The memory device of claim 1, further comprising:

a word line coupled to the memory cell unit for activating the memory cell; and a reference word line coupled to one transistor of the at least two transistors for activating the reference circuit.

10. A memory device comprising:

a memory cell unit including a memory cell;

a sense amplifier coupled to the memory cell unit and configured to compare a current that flows through the memory cell to a reference current to sense a bit of data stored in the memory cell and to output the amplified bit of data; and a reference circuit coupled to the sense amplifier, configured to generate the reference current, and including a pair of magnetic resistive elements coupled in parallel and in a high resistance state;

a pair of transistors coupled to the magnetic resistive elements and coupled to each other; and a metal short between the pair of magnetic resistive elements and the pair of transistors, the metal short configured to control the generation of the reference current through one transistor of the pair of transistors.

11. The memory device of claim 10, wherein at least one of the magnetic resistive elements is a magnetic tunneling junction (MTJ) in an anti-parallel state.

12. The memory device of claim 10, further comprising a resistive unit having a substantially constant resistance and coupled in series with the magnetic resistive elements.

13. The memory device of claim 10, wherein the pair of transistors are selectively controllable so as to control contributions of the magnetic restrictive elements to the reference current.

14. A method comprising:

generating a reference current that corresponds to a resistance of a magnetic resistive element that is in a high resistance state, a resistance of a resistive unit that has a substantially constant resistance, and a metal short between the magnetic resistive element and a pair of transistors, the pair of transistors coupled to each other;

comparing a current that flows through a memory cell to the reference current to sense a bit of data stored in the memory cell; and providing as an output the sensed bit of data.

15. The method of claim 14, wherein generating the reference current includes generating the reference current that corresponds to a total resistance of a pair of the magnetic resistive elements coupled in parallel.

16. The method of claim 15, wherein generating the reference current includes generating the reference current that further corresponds to a resistance of the resistive unit coupled in series with the magnetic resistive elements.

17. The method of claim 14, wherein generating the reference current includes generating the reference current that corresponds to a total resistance of the resistive unit and the magnetic resistive element coupled in parallel.

18. The method of claim 14, further comprising:

transmitting control signals to control a number of magnetic resistive elements to put those magnetic resistive elements into an anti-parallel state for contributing to generation of the reference current.

19. The method of claim 18, wherein the control signals are applied to multiple transistors during initialization to set the magnetic resistive elements to the anti-parallel state, and wherein a single control signal is applied to one of the multiple transistors to generate the reference current.

20. The memory device of claim 1, wherein the at least two transistors are selectively controllable so as to control contributions of the magnetic restrictive element to the reference current.

* * * * *